May 26, 1964

W. V. WRIGHT, JR 3,134,930

MICROMINIATURE CIRCUITRY

Filed Nov. 17, 1961

WILLIAM V. WRIGHT, Jr.
INVENTOR.

BY HIS ATTORNEYS.

Spensley & Horn.

3,134,930
Patented May 26, 1964

3,134,930

MICROMINIATURE CIRCUITRY

William V. Wright, Jr., San Marino, Calif., assignor to Electro-Optical Systems, Inc., Pasadena, Calif., a corporation of California Filed Nov. 17, 1961, Ser. No. 153,040
4 Claims. (Cl. 317—101)

This invention pertains to the microminiaturization of electronic circuitry and more particularly to the combination of miniature circuit elements arranged in an array.

The object of microminiaturization in the electronic art is to reliably package electronic circuitry into as small a volume as possible while still providing adequate electrical connection thereto. Various generalized approaches have been taken in the development of microminiaturization techniques. One basic prior art approach, commonly known as the "component oriented" approach is based upon tighter packaging techniques utilizing conventional components, miniaturized components and miniaturized hardware accessories. In a refinement of the component oriented approach, all components are of a common form, such as shape, area, or thickness. Examples of this basic prior art approach are micromodule structures and printed circuits using conventional components. Micromodule structures are formed by mounting individual components or sub-circuits to a wafer which forms the basic building block of the structure. A plurality of wafers, each wafer containing a desired electrical circuit component or sub-circuit, are stacked and interconnected by riser wires, the resulting structure then being potted in an insulative material. A disadvantage of micromodule structures and printed circuits utilizing conventional components is that a high packing density, on the order of 10,000 components per square inch, for example, cannot be achieved.

Another prior art microminiaturization approach utilizes substrates containing circuits and sub-circuits, generally in thin-film form. In still another prior art approach, a single piece of semiconductor material is altered to obtain the desired functions. Although high packing densities are achievable with the substrate and multi-junction semiconductor approaches, they both suffer from the attendant disadvantages of circuit element irreplaceability and low production yields. If one of the circuit elements in the unit (the substrate or the semiconductor body) should fail, then the entire unit must be replaced. This fact must be taken into consideration by the circuit designer who must then decide the extent of the electrical circuitry to be included in each unit. During the manufacture of the units, if one of the circuit elements is faulty, then the entire unit must be discarded, thereby resulting in low production yields for relatively complex circuits. Furthermore, due to the nature of the unit structure when utilizing either of the substrate or multi-junction semiconductor approaches, no significant degree of unit prefabrication is possible. Hence, the manufacturer is effectively precluded from maintaining an inventory and can employ his production facilities only upon receipt of an order. This places the manufacturer at a practical disadvantage, the disadvantage probably being reflected in a higher unit cost. The manufacturer of microminiaturized circuits utilizing the aforementioned micromodule approach, on the other hand, can maintain an inventory of different wafers which are used as the basic building blocks and can be relatively continually manufacturing the basic wafers. Upon receipt of an order, it is merely necessary to select the proper wafers and assemble them upon the riser wires and pot the resulting unit. At the present state of the art, there exists a need for a microminiaturization technique combining relatively high packaging densities with high production yields while still permitting a significant degree of unit prefabrication wherein one faulty circuit component will not render the entire unit useless.

Accordingly, it is an object of the present invention to provide improved microminiaturized circuits containing a plurality of electrical components.

It is also an object of the present invention to provide improved microminiaturized circuits containing a plurality of electrical components arranged for convenient, selective electrical connection to individual components.

It is another object of the present invention to provide microminiaturized structures containing a plurality of electrical components arranged so that packing densities on the order of 10,000 components per square inch and higher can be achieved, the resulting structure being adapted for the electrical interconnection of preselected components.

It is a further object of the present invention to provide improved microminiaturized structures containing a plurality of electrical components, the electrical contacts of which are disposed in a planar array.

It is a still further object of the present invention to provide improved microminiaturized structures containing a plurality of identically shaped electrical components arranged in parallel alignment with a high packing density.

It is yet another object of the present invention to provide improved microminiaturized structures containing a plurality of electrical components in an array suitable for computer programming of the electrical interconnection of preselected individual components.

The objects of the present invention are accomplished, in a presently preferred embodiment, by a novel circuit structure in which each circuit element is formed from a filamentary semiconductor crystal of identical size. The filamentary crystals are mounted in parallel alignment in holes extending between parallel planar faces of a matrix block, the ends of each crystal being flush with a face of the block. Interconnection of certain desired crystals to form an electric circuit is accomplished by the placement of an electrically conductive pattern upon the faces of the block, such as by the use of photolithographic techniques, the pattern contacting the ends of the crystals to which connection is to be made. The present invention structure is particularly suitable for use in a memory system, the interconnection scheme for a specific memory plane being conveniently determined by conventional computer means into which is fed the circuit properties of the crystal elements. The present invention technique of mounting the circuit elements in a matrix block insures a high production yield merely by providing a plurality of identical circuit elements in each matrix block. If one of the circuit elements is faulty, it is not used and electrical connection is made to another circuit element having the desired parameters. Furthermore, the provision of a wide variety of circuit elements of different parameters in a matrix block to which electrical connections are subsequently made enables the manufacturer to maintain an inventory of matrix blocks and upon receipt of an order merely to provide the electrical connections giving the desired electrical circuit. Although the present invention concepts are particularly suitable for use with electrical components formed of filamentary semiconductor crystal bodies of identical shape and size, it will become apparent to those skilled in the art that the disclosed concepts can be advantageously utilized with other forms of circuit components, not necessarily of identical shapes and sizes.

The novel features which are believed to be characteristic of the invention, both as to its organization and method of operation, together with further objects and advantages thereof, will be better understood from the following description considered in connection with the accompanying drawing in which embodiments of the invention are illustrated by way of example. It is to be expressly understood, however, that the drawing is for the purpose of illustration and description only, and is not intended as a definition of the limits of the invention.

Figure 1:
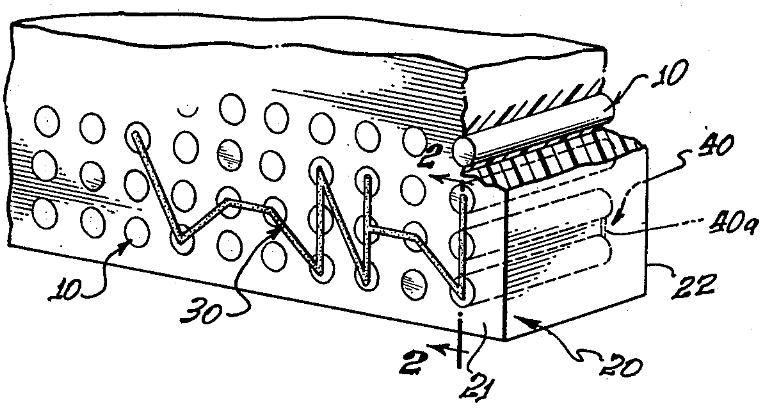
FIGURE 1 is a partial perspective view showing a solid-state component array in accordance with one embodiment of the present invention.
Figure 2:
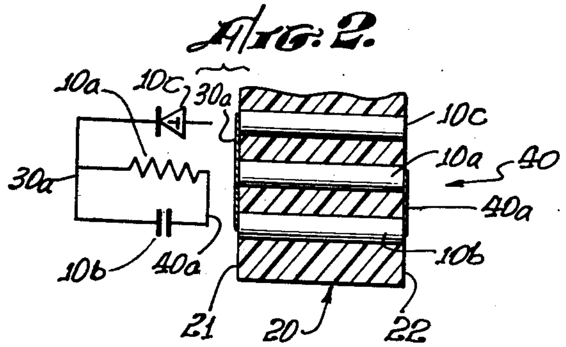
FIGURE 2 is a view taken along the line 2—2 of FIGURE 1.

Referring now to the drawing, in FIGURES 1 and 2 thereof there is shown a presently preferred embodiment of a solid-state component array in accordance with the concepts of the present invention, wherein a plurality of circuit elements having a common basic form are arranged in a planar array. Each basic circuit element comprises a whisker 10 fabricated from a filamentary unitary semiconductor crystal. The electrical properties of the whiskers 10 may be selectively modified by techniques well known to the art so that the whiskers can form such circuit elements as linear resistors 10*a*, capacitors 10*b* and active devices such as tunnel diodes 10*c*. The semiconductor whiskers 10 are typically of circular cross-section with a diameter of from about 0.5 to 5 mils and an overall length of about 10 to 50 mils. In the illustrative embodiment, the whiskers 10 are silicon single crystals having a 1 mil diameter and a 10 mil length.

The whiskers 10 are mounted in parallel alignment in a matrix 20. The matrix 20 is in the form of a rectangular block constructed of an electrical insulating material such as epoxy or a ceramic, for example. The matrix block 20 has parallel, planar side faces 21 and 22. An evenly spaced series of holes are provided through the block between the faces 21 and 22, the diameter of the holes being sufficient to accommodate the whiskers 10 therein. In the illustrative embodiment of FIGURES 1 and 2, the matrix faces 21 and 22 are about 1 centimeter square and the holes therethrough are spaced about 3 mils apart, thereby resulting in a packing density in excess of 10,000 whiskers per square inch.

To form a planar array, a whisker 10 is inserted into each of the holes in the matrix block 20. The complete array will consist of many different circuit elements arranged in any desired order. For example, the bottom row of whiskers might all be of capacitors 10*b*, the row above it all of resistors 10*a* and the next row all of tunnel diodes 10*c*. The whiskers 10 are rigidly maintained in the holes in the matrix block 20 by a bonding process such as thermosetting or catalyst insulating plastic. Upon mounting of the whiskers 10 in the matrix block 20, the faces 21 and 22 of the matrix block 20 may be lapped flat and parallel to facilitate the application of electrical interconnections.

Electrical interconnections to the various circuit elements in the matrix block 20 can be formed by application of an electroconductive pattern to the matrix face 21, the pattern being formed of electrically conductive lines arranged to contact the ends of the particular whiskers 10 to which it is desired to make electrical connection. Such a pattern is illustrated in FIGURES 1 and 2 and indicated by the reference numeral 30. Similarly, an electroconductive pattern 40 may be applied to the other matrix face 22 in accordance with the desired connections to the other ends of the particular whiskers 10. The patterns 30 and 40 can conveniently be made by photolithographic or masked evaporation techniques well known in the art. By proper pattern configurations, the circuit elements formed by the whiskers 10 can be selectively connected in parallel, in series, and series-parallel combinations. In the cut-away view of FIGURE 2, for example, a series-parallel combination is shown. The lowermost whisker is a capacitor 10*b*, the whisker above it is a resistor 10*a*, and the uppermost whisker is a tunnel diode 10*c*. A portion 30*a* of the pattern 30 applied to the matrix face 21 forms a vertical line contacting an end of each of the whiskers 10*a*, 10*b* and 10*c*, as shown in FIGURE 2 both in physical form and in the corresponding electrical schematic form. On the opposite face 22 of the matrix block 20, a vertical portion 40*a* of the mask 40 is shown as interconnecting the other end of the whisker 10*b* and the whisker 10*a*. As can be seen from the electrical schematic diagram portion of FIGURE 2, corresponding to the physical placement and connection of the whiskers 10*a*, 10*b* and 10*c*, an electrical circuit wherein a tunnel diode is connected in series with the parallel combination of a resistor and a capacitor is provided.

The resulting structure of FIGURES 1 and 2 provides an ideal solid-state memory plane. The circuit properties of each of the whiskers 10 contained in the matrix block 20 can be fed into a conventional computer for determination of the interconnection scheme for a specific desired circuit configuration. As mentioned hereinabove, the circuit configuration is provided by application of a suitable electroconductive pattern to form the interconnection between the ends of the selected whiskers 10. Since the spacing of each circuit element (each whisker 10) is accurately prelocated in the matrix block 20, the electrical properties of each component can be automatically tested by a suitable machine and the electrical parameters of each whisker by actual test can then be catalogued in a computer memory. The computer can be programmed to solve the interconnection pattern required for any desired circuit using the actual parameters for each individual component. The appropriate pattern is then made by evaporating or depositing the predetermined interconnecting lines across the exposed ends of the particular whiskers 10 to be utilized. It is thus apparent that although the matrix block 20 contains many different circuit elements, either all or only certain ones of the whiskers 10 may be utilized in a particular circuit configuration. Each circuit element can be individually tested, catalogued, and used as required in the final circuit interconnection. Faulty circuit elements can be bypassed and a great number of different circuits can be designed using common known circuit parameters. Therefore, by making some of the plurality of resistors, tunnel diodes, etc., identical in each matrix block, should one of the elements be faulty in manufacture, it can be bypassed without the necessity of discarding the entire matrix.

Since all interconections are made on planar faces of the matrix block by a common process, fabrication of electrical circuits is enormously simplified. Furthermore, in addition to two terminal devices, such as resistors, capacitors and tunnel diodes in the filamentary geometry shown, three terminal and multi-terminal devices can also be used in the same matrix by utilizing adjacent holes in matrix block for the additional necessary leads.

The matrix block itself may be of any desired shape or size, while still presenting two faces to which electrical connection can be made. By the utilization of parallel planar faces, all of the whiskers 10 may be of an identical size, and a rectangular matrix shape provides parallel planar faces in a convenient building block shape.

Figure 4:
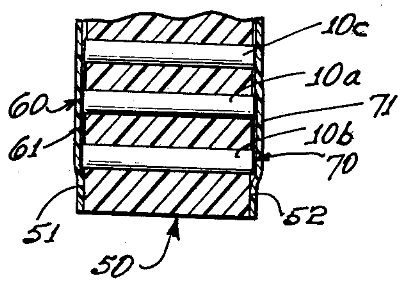
Figure 3:
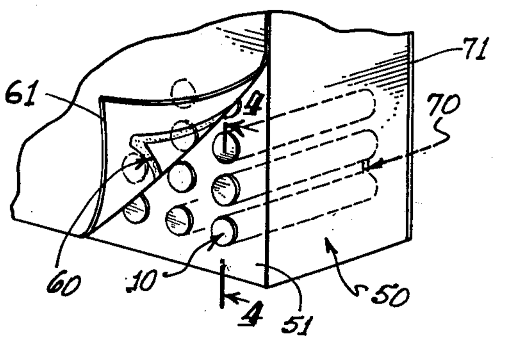
FIGURE 3 is a partial perspective view showing a component array in accordance with another embodiment of the present invention in which an electrical contact pattern is formed on a card, and with one corner of the card shown pulled back in order to more clearly depict the underlying structure; and, FIGURE 4 is a view taken along the line 4—4 of FIGURE 3.

In the hereinabove illustrated embodiment shown in FIGURES 1 and 2, the complete memory plane has permanently attached thereto the electrical interconnections of the various whiskers 10. Alternatively, a detachable pattern of the desired interconnections would allow the use of a single matrix in various successive circuit configurations, merely by substitution of interconnection patterns. Such an embodiment is illustrated in FIGURES 3 and 4 of the drawing. Again, the whiskers 10, having specified circuit forms such as a resistor 10*a*, a capacitor 10*b*, or a tunnel diode 10*c*, can be used. In this embodiment, a rectangular matrix block 50 is utilized, similar to the matrix block 20 in the embodiments of FIGURES 1 and 2, except that the thickness of the matrix block is slightly less than the length of the whiskers 10 so that the ends of the whiskers 10 protrude slightly from the opposite faces 51 and 52 of the matrix block 50. Electrical interconnection of pre-selected whiskers is accomplished, as before, by the use of electroconductive patterns, indicated generally by the reference numerals 60 and 70. However, the patterns 60 and 70 are deposited, not upon the planar faces of the matrix block 50, but upon cards 61 and 71, respectively, fabricated of an electrical insulating material. The card 61, with the pattern 60 deposited thereon, is shown in FIGURE 3 as being disposed contiguous with the face 51 of the matrix block 50 and the protruding ends of the whiskers 10 contained therein. In the view of FIGURE 3, one corner of the card 61 is bent back in order to illustrate the protruding ends of the whiskers 10 in the matrix block 50. The card 71, with the pattern 70 attached thereon, is positioned contiguous with the planar face 52 of the matrix block 50. The view of FIGURE 4 shows the cards 61 and 71 in their proper position and being pressed against the protruding ends of the whiskers 10 to maintain adequate electrical connection thereto. The alignment of the whiskers and the mask is identical to the schematic circuit diagram of FIGURE 2, the whisker 10*c* being electrically connected in series with the parallel combination of the whiskers 10*a* and 10*b*. The cards 61 and 71, upon which the electroconductive material is deposited in the desired predetermined patterns, can be either of a rigid or a semi-flexible material, such as fiberglass epoxy, for example. The height and width of the cards 61 and 71 are identical with the height and width of the matrix block 50 in order to insure perfect alignment thereon, the cards being maintained in contact with the whisker ends and matrix faces by mechanical pressure.

The memory plane embodiment shown in FIGURES 3 and 4 is particularly useful for testing and experimentation, wherein it is desired to utilize or compare a plurality of electrical circuits. Since one matrix contains a sufficient variety of electrical components to form many electrical circuits, it is merely necessary to utilize only one matrix in conjunction with a plurality of connection cards to form the various desired circuitry.

Thus, there has been described a novel microminiaturization technique utilizing a machine-loaded closely packed matrix in which are disposed filamentary active and passive circuit elements in a known array. The resulting structure of the matrix is suitable for feeding to automatic or semi-automatic component parameter measuring equipment for cataloguing of the individual parameters in a computer memory, the computer then solving the interconnection pattern for a desired circuit. The circuit interconnection can be completed in a single operation wherein the interconnection pattern can be varied from matrix-to-matrix as circuit requirements and parameters change. Alternatively, the electrical interconnections can be deposited as a pattern upon a card, the card being detachably affixed to the matrix to provide the electrical connections, a variety of connection cards providing a variety of electrical circuits for a single matrix. Other embodiments, utilizing the basic concepts of the present invention, will become apparent to these skilled in the art. For example, the individual electronic components can be of various forms and need not be fabricated from semiconductor materials. Standard miniaturized resistors, diodes, etc. can be utilized; however, the packing density will be somewhat less than that obtainable with the particular components used in the illustrated embodiments. Hence, although the invention has been described with a certain degree of particularity, it is understood that the present disclosure has been made only by way of example, and that numerous changes in the combination and arrangement of parts may be resorted to without departing from the spirit and the scope of the invention as hereinafter claimed.

What is claimed is:

1. A microminiaturized electrical circuit comprising a block of electrically insulating material, said block having parallel planar side faces, holes through said block between said faces, said holes being evenly spaced and accurately prelocated, whiskers in each hole, said whiskers being fabricated from filamentary unitary semiconductor crystals having predetermined electrical properties, said whiskers being positioned in rows according to similar electrical properties whereby certain rows consist of similar linear resistors, other rows consist of similar capacitors and other rows have active devices such as tunnel diodes, said whiskers being secured within said holes, conductive means interconnecting selected whiskers in accordance with a predetermined interconnection scheme, thereby bypassing faulty whiskers and whiskers unnecessary for a selected use of said circuit.

2. A microminiaturized electrical circuit comprising a block of electrically insulating material, said block having parallel planar side faces approximately 1 centimeter square, holes through said block between said faces, said holes being evenly spaced and accurately prelocated on the order of three mils apart and having a density of about 10,000 holes per square inch, said holes being within a range of .5 to 5 mils in diameter, whiskers in each hole, said whiskers being fabricated from filamentary unitary semiconductor crystals having predetermined electrical properties, said whiskers being positioned in rows according to similar electrical properties whereby certain rows consist of similar linear resistors, other rows consist of similar capacitors and other rows have active devices such as tunnel diodes, said whiskers being secured in said holes, and conductive interconnecting lines across the ends of selected whiskers in accordance with a predetermined interconnection scheme, thereby by-passing faulty whiskers and whiskers unnecessary for a selected use of said circuit.

3. A microminiaturized electrical circuit comprising a block of electrically insulating material, said block having parallel planar side faces, holes through said block between said faces, said holes being evenly spaced and accurately prelocated, whiskers in each hole, said whiskers being fabricated from filamentary unitary semiconductor crystals having predetermined electrical properties, said whiskers being positioned in rows according to similar electrical properties whereby certain rows consist of similar linear resistors, other rows consist of similar capacitors and other rows have active devices such as tunnel diodes, said whiskers being bonded in said holes, conductive interconnecting lines across the ends of selected whiskers in accordance with a predetermined interconnection scheme, thereby by-passing faulty whiskers and whiskers unnecessary for a selected use of said circuit, insulated cards with conductive patterns thereon secured against said faces, said whiskers being slightly longer than the block thickness so the ends thereof protrude against said cards to thereby electrically connect selected whiskers with said patterns on said cards.

4. A microminiaturized electrical circuit comprising a block of electrically insulating material, said block having planar side faces, predetermined holes through said block between said faces, whiskers in each said hole, each said whisker being fabricated from filamentary unitary semiconductor crystals having predetermined electrical properties, said whiskers of predetermined properties being in selected ones of said holes in accordance with a preselected pattern, said whiskers being secured in said holes, and conductive means interconnecting selected whiskers in accordance with a predetermined interconnection scheme, whereby faulty whiskers and whiskers unnecessary for a selected use of said circuit are by-passed.

References Cited in the file of this patent

UNITED STATES PATENTS

| | | |
|---|---|---|
| 2,862,992 | Franz | Dec. 2, 1958 |
| 2,915,680 | Kong | Dec. 1, 1959 |
| 3,029,495 | Doctor | Apr. 17, 1962 |
| 3,098,950 | Geshner | July 23, 1963 |